United States Patent [19]

Adair et al.

[11] Patent Number: 4,535,050
[45] Date of Patent: Aug. 13, 1985

[54] PEELING DEVELOPMENT OF PHOTOSENSITIVE MATERIALS EMPLOYING MICROENCAPSULATED RADIATION SENSITIVE COMPOSITIONS

[75] Inventors: Paul C. Adair; David G. Adkins, both of Chillicothe, Ohio

[73] Assignee: The Mead Corporation, Dayton, Ohio

[21] Appl. No.: 514,397

[22] Filed: Jul. 18, 1983

[51] Int. Cl.³ .................. G03C 1/40; G03C 1/68; G03C 1/495
[52] U.S. Cl. .................... 430/138; 430/211; 428/321.5; 346/200; 346/226
[58] Field of Search .............. 430/138, 211, 235; 428/320.6

[56] References Cited

U.S. PATENT DOCUMENTS

| | | | |
|---|---|---|---|
| 2,953,454 | 9/1960 | Berman | 430/345 |
| 3,001,873 | 9/1961 | Foris | 430/138 |
| 3,072,481 | 1/1963 | Berman et al. | 430/138 |
| 3,090,687 | 5/1963 | Berman | 430/138 |
| 3,116,148 | 12/1963 | Miller | 430/138 |
| 3,219,446 | 11/1965 | Berman | 430/138 |
| 3,525,615 | 8/1970 | Chambers | 430/253 |
| 3,700,439 | 10/1972 | Phillips | 430/138 |
| 3,736,139 | 5/1973 | Yamashita et al. | 430/353 |
| 3,891,441 | 6/1975 | Tsuji | 430/273 |
| 3,892,569 | 7/1975 | Speers | 430/541 |
| 4,149,887 | 4/1979 | Levy | 430/138 |
| 4,169,731 | 10/1979 | Noshir | 430/253 |
| 4,262,079 | 4/1981 | Steelman | 430/253 |
| 4,399,209 | 8/1983 | Sanders | 430/138 |

FOREIGN PATENT DOCUMENTS

| | | |
|---|---|---|
| 44-17733 | 8/1969 | Japan . |
| 49-6212 | 2/1974 | Japan . |
| 52-34488 | 9/1977 | Japan . |
| 53-9519 | 1/1978 | Japan . |
| 53-9520 | 1/1978 | Japan . |
| 57-124343 | 8/1982 | Japan . |
| 57-179836 | 11/1982 | Japan . |
| 57-197538 | 12/1982 | Japan . |
| 58-23025 | 2/1983 | Japan . |
| 58-17432 | 2/1983 | Japan . |
| 58-23024 | 2/1983 | Japan . |
| 58-45084 | 3/1983 | Japan . |
| 58-45090 | 3/1983 | Japan . |
| 1001831 | 8/1965 | United Kingdom . |
| 1001832 | 8/1965 | United Kingdom . |
| 1058798 | 2/1967 | United Kingdom . |
| 1141475 | 1/1969 | United Kingdom . |
| 1193293 | 6/1970 | United Kingdom . |

OTHER PUBLICATIONS

"What's Ahead", Lloyd E. Varden, Modern Photography, p. 86, 1958.

Primary Examiner—John L. Goodrow
Attorney, Agent, or Firm—Biebel, French & Nauman

[57] ABSTRACT

An improved means for exposing and developing photosensitive sheets employing a microencapsulated radiation sensitive composition wherein a cover sheet is adhered to a layer of the microcapsules and following exposure the cover sheet is peeled away to rupture the microcapsules and develop the image. The cover sheet also reduces the oxygen concentration at the surface of the microcapsules and thereby enhances the sensitivity of the imaging sheet.

27 Claims, 3 Drawing Figures

PEELING DEVELOPMENT OF PHOTOSENSITIVE MATERIALS EMPLOYING MICROENCAPSULATED RADIATION SENSITIVE COMPOSITIONS

BACKGROUND OF THE INVENTION

The present invention relates to a convenient means for developing photosensitive materials employing a microencapsulated radiation sensitive composition. More particularly it relates to a photosensitive material of the above type provided with a peelable cover sheet which is used to rupture the microcapsules following exposure.

Photosensitive materials employing microencapsulated radiation sensitive compositions are the subject of U.S. Pat. Nos. 4,399,209 and 4,440,846 assigned to The Mead Corporation and Japanese Laid-Open Applications Nos. 57-124343, 57-179836 and 57-197538 to Fuji Photo Film Co., Ltd. In a typical example of the aforementioned photosensitive materials, a color precursor of the electron donor type is encapsulated with a radiation sensitive material and a layer of the microcapsules is coated on a support to provide an imaging sheet. The imaging sheet is image-wise exposed and then assembled with a developer sheet carrying a material which reacts with the color precursor to produce a color image. The assembled sheets are passed together through the nip between two pressure rollers whereupon the microcapsules rupture and image-wise release the color precursor which is transferred to the developer sheet where it reacts and forms an image. In another embodiment, the developer is carried on the imaging sheet in a layer underlying the layer of microcapsules. This sheet is exposed and passed through a pressure nip whereupon the microcapsules rupture and the color precursor migrates to the underlying developer layer where it reacts and forms an image.

The following patents describe other imaging materials employing microcapsules:

Berman, U.S. Pat. No. 3,219,446 discloses a transfer imaging process in which a blue-black dye is encapsulated with a photocrosslinkable polymer or a photopolymerizable monomer in a film or a layer of discrete microcapsules. In this system imaging is accomplished by image-wise exposing the layer of the encapsulated material to electromagnetic radiation to crosslink the polymer or polymerize the monomer. This is said to cause the liquid in the exposed microcapsules to assume a non-liquid, rigid condition, such that upon rupturing the microcapsules only the dye from the unexposed microcapsules is transferred to a receiving sheet where images are formed.

Phillips, U.S. Pat. No. 3,700,439, discloses a process wherein Michler's ketone is encapsulated in a conventional manner and provided as a layer on a support. Michler's ketone is not a color former, but irradiation of the ketone converts it to a colorless, acid colorable, dye precursor. Thus, by image-wise exposing the Phillips material to actinic radiation and rupturing the microcapsules in contact with an acid developer layer, such as a layer of acid clay, a visible image is obtained in the areas in which the ketone has been converted to the acid colorable form by irradiation. Phillips also discloses a self-contained system in which the acid developer is on the same support as the microcapsules containing the Michler's ketone.

Levy, U.S. Pat. No. 4,149,887, relates to a microcapsule-containing imaging material having a photoconductive internal phase which is exposed in an RF field. Exposure increases the conductivity of the internal phase and causes the microcapsules to heat, swell and then rupture in the exposed areas thereby freeing the contents to form images. The microcapsules may contain color precursors which form images by reacting with a developing agent.

Japanese Kokai, No. 6212/1974 to Matsushita Denki Sangyo K. K., relates to a recording material in which microcapsules having a photocrosslinkable polymer wall contain a colorless or substantially colorless precursor in a polar solvent and, optionally, an acid dye developer. The polar solvent prevents the color precursor from reacting with the acid dye developer and forming a color image. Images are formed by image-wise exposing the material to actinic radiation and rupturing the microcapsules in the unexposed areas, whereupon the polar solvent evaporates and color development occurs.

Japanese Kokai, Nos. 9519 and 9520/1978 to K. K. Ricoh, relate to imaging systems in which the microcapsules contain a radiation curable internal phase including a dye precursor. Images are formed by image-wise exposing a layer of the microcapsules to light and selectively transferring the microcapsules from the unexposed areas to a receiving sheet. The microcapsules are not ruptured. Upon subsequent wet development processing of the transfer sheet with a dye developer, the dye precursor in the microcapsules is converted to a colored form and an image is obtained.

British Pat. Nos. 1,058,798; 1,141,475; and 1,193,923 to DuPont relate to imaging materials which employ a photopolymerizable substratum comprising a solid binder having a polymerizable ethylenically unsaturated compound dispersed therein. Images are formed by image-wise exposing the materials to actinic radiation. Exposure controls the rate of diffusion of a developer material into or out of the photopolymerizable substratum.

British Pat. No. 1,001,832 to DuPont discloses an imaging material in which a color former may be incorporated in a layer of a photopolymerizable, ethylenically unsaturated compound and an oxygen impermeable cover sheet is placed over the photopolymerizable layer during exposure to limit the concentration of atmospheric oxygen in contact with the photopolymerizable layer and thereby increase the speed and sensitivity of the photopolymerizable material.

Currently, the principal means used in developing photosensitive materials employing a microencapsulated radiation sensitive composition are nip rollers and burnishing devices. These devices are costly to manufacture and use and require frequent maintenance. Thus, there is a need for a less expensive and more efficient means of developing these materials.

DEFINITIONS

The term "microcapsule" is used herein to refer to both microcapsules having a discrete wall and microcapsules formed in an open phase system wherein discrete droplets of photoactive internal phase are dispersed in a binder. Thus, whenever reference is made to "microcapsules" or "encapsulation" in the specification and appended claims, without reference to a discrete microcapsule wall, both types of microcapsules are intended.

The term "image areas" as used herein means the areas in which the internal phase is released from the microcapsules, regardless of whether the image formed is a positive or negative image.

The term "actinic radiation" is open to the entire electromagnetic spectrum and includes ultraviolet, infrared, visible, X-ray and other radiation sources such as ion beam.

SUMMARY OF THE INVENTION

A principal objective of the present invention is to provide a more convenient means of developing photosensitive materials employing microencapsulated radiation sensitive compositions wherein following exposure the microcapsules are ruptured by removing a cover sheet adhered to the microcapsule layer.

It has been explained previously in commonly assigned applications Ser. Nos. 320,356 and 320,643 that irradiation of photosensitive materials, which employ a microencapsulated radiation sensitive composition, causes a change in the viscosity of the internal phase of the microcapsules which prevents the microcapsules from rupturing or releasing their contents. By imagewise exposing an imaging sheet provided with a layer of the microcapsules to actinic radiation and passing the sheet through a pressure nip, the internal phase is released from the microcapsules in relation to the degree of exposure. The present invention is based on the discovery that the same type of image-wise release of the internal phase from the microcapsules can be achieved without passing the sheet through a pressure nip by removing an adherent cover sheet from the microcapsule layer. Apparently, the same phenomena that prevent microcapsules in non-image areas from releasing their contents and permit those in image areas to release theirs upon application of pressure are also applicable to peeling development using a cover sheet. Although it is not clear whether only the microcapsules in the image areas rupture and release the internal phase when the cover sheet is pulled away, or whether microcapsules in both the image and non-image areas rupture but only the microcapsules in the image areas release their contents, it is apparent that the internal phase is image-wise released from the microcapsules upon peeling development in accordance with the present invention.

An imaging sheet in accordance with the present invention comprises: a support, a layer of microcapsules containing an internal phase including a radiation sensitive composition which undergoes a change in viscosity upon exposure to actinic radiation, and a strippable cover sheet formed from a material capable of uniformly transmitting actinic radiation; wherein the cover sheet adhered to the layer of microcapsules, and the imaging sheet is capable of forming images by image-wise exposing the sheet to actinic radiation and removing the cover sheet such that the microcapsules rupture and image-wise release the internal phase.

The cover sheet can be adhered to the layer of microcapsules during production of the imaging sheet, or the cover sheet can be used simply as a developing means and applied to the microcapsules after exposure. Furthermore, while the cover sheet is adhered to the imaging sheet using a layer of an adhesive in most cases, an adhesive layer is not essential in that by appropriate techniques a cover sheet can be directly adhered to the microcapsule walls such that it ruptures the microcapsules when it is removed.

In the most typical case, an image-forming agent is associated on the sheet with the microcapsules, and the image-forming agent is mobilized or otherwise activated when the microcapsules are ruptured and the internal phase is released. One example of a suitable image-forming agent is a color former; another example is an oil soluble dye; still another example is a chelate-forming compound. However, it is not necessary to use an image-forming agent with the sheet since the radiation sensitive composition itself can function in that capacity as described later herein.

Another embodiment of the invention is a self-contained imaging sheet wherein a color former is associated with the microcapsules and a developer material is incorporated in the imaging sheet such that when the cover sheet is removed and the microcapsules are ruptured, the color former reacts with the developer to produce an image.

The present invention also provides imaging processes wherein the aforementioned materials are exposed image-wise to actinic radiation, the cover sheet is peeled away and images are obtained. While it is preferable from the standpoint of manufacturing and handling to attach the cover sheet prior to exposure and to expose the imaging sheet through the cover sheet, it is not essential. Hence, the present invention also provides imaging processes wherein an imaging sheet manufactured without the cover sheet is exposed, the cover sheet is applied to the layer of microcapsules, and the sheet is developed by peeling the cover sheet away to produce an image.

DETAILED DESCRIPTION OF THE INVENTION

Figure 1:
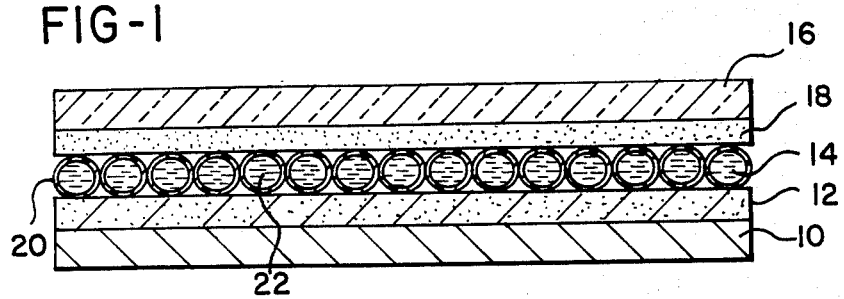
FIG. 1 is a diagrammatic sectional view of a self-contained imaging sheet of the present invention (cover sheet attached)

The self-contained imaging sheet shown in FIG. 1 comprises a support 10, a layer of a developer material 12, a layer of microcapsules 14, and a cover sheet 16 adhered to the layer of microcapsules 14 by a layer of adhesive 18. The microcapsules shown in drawings are not drawn to scale. In actuality, the microcapsules are much smaller and many more microcapsules than shown are exposed upon imaging.

The microcapsules 14 illustrated in the drawings are microcapsules with discrete microcapsule walls 20 containing a liquid internal phase 22 which contains a photohardenable material. It will be understood from the discussion herein, however, that the present invention is also open to embodiments in which the microcapsules are formed by an open phase system and in which the radiation sensitive composition employs a photosoftenable material.

Figure 2:
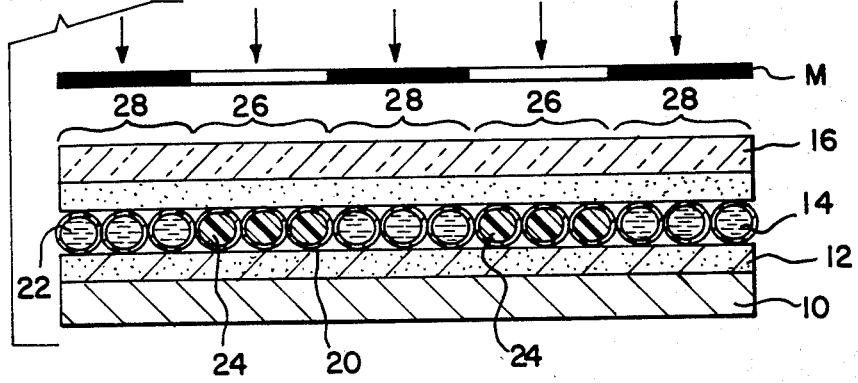
FIG. 2 is a sectional view of exposure of the imaging sheet of FIG. 1.

As shown in FIG. 2, exposure of the imaging sheet through photomask M by actinic radiation (arrows) causes the internal phase to increase in viscosity in the exposed areas. This is shown as solidifying the internal phase 24 in the exposed areas 26. In actuality the internal phase may not be solid and may only be converted to a more viscous oil, semi-solid or gel form in the exposed areas. In the unexposed areas 28, however, the internal phase remains liquid.

Figure 3:
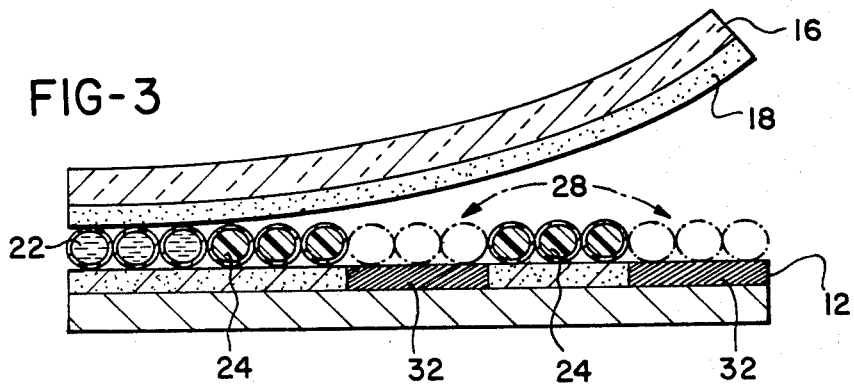
FIG. 3 is a diagrammatic sectional view of the self-contained sheet following exposure and development by removing the cover sheet.

Upon removal of the cover sheet 16, the microcapsules in the unexposed areas 28 rupture and release the liquid internal phase 22 as shown in FIG. 3. The internal phase 22 diffuses to the developer layer 12 where it reacts to produce image areas 32. The microcapsules in the exposed areas 26 of FIG. 2 are shown as being intact following removal of cover sheet 16, however, it is not clear to the applicants whether the microcapsules in these areas actually rupture or not. It is possible that the microcapsules rupture, but due to the solidification or increased viscosity of the internal phase, the internal phase is not released from the microcapsules, i.e., it does not migrate from those areas to the developer layer and form color.

The imaging sheets and processes of the present invention can be used in conjunction with various radiation sensitive materials and image-forming agents to produce images by a number of different techniques.

For example, positive working photohardenable or negative working photosoftenable radiation sensitive compositions can be used. Photohardenable compositions such as photopolyermizable and photocrosslinkable materials increase in viscosity or solidify upon exposure and yield positive images. Photosoftenable materials, such as some photodecomposable or photodepolymerizable materials, decrease in viscosity and result in negative images.

Ethylenically unsaturated organic compounds are useful radiation curable materials. These compounds contain at least one terminal ethylene group per molecule. Typically, they are liquid. Polyethylenically unsaturated compounds having two or more terminal ethylene groups per molecule are preferred. An example of this preferred subgroup are ethylenically unsaturated acid esters of polyhydric alcohols, such as trimethylol propane triacrylate (TMPTA).

Another suitable radiation sensitive composition is an acrylate prepolymer derived from the partial reaction of pentaerythritol with acrylic acid or acrylic acid esters. Photosensitive compositions based on these prepolymers having an acrylate functionality of between approximately two and three are available commercially in two-package systems from The Richardson Company, Melrose Park, Ill., such as RL-1482 and RL-1483. These are recommended to be mixed together to form a radiation curable clear varnish in a ratio of 4.4 parts of RL-1482 to one part RL-1483.

Another group of substances useful as radiation sensitive compositions include isocyanate modified acrylic, methacrylic and itaconic acid esters of polyhydric alcohols as disclosed in U.S. Pat. Nos. 3,783,151; 3,759,809 and 3,825,479, all to Carlick et al. Radiation curable compositions including these isocyanate modified esters and reactive diluents such as tetraethylene glycol diacrylate as well as photoinitiators such as chlorinated resins, chlorinated paraffins and amine photoinitiation synergists are commercially available as over print varnishes from Sun Chemical Corp., Carlstat, N.J., under the tradename of Sun Cure resins.

The radiation sensitive component of several radiation curable inks is also suitable for use in this invention. An example of this type of material is a mixture of pentaerythritol acrylate and a halogenated aromatic, alicyclic or aliphatic photoinitiator, as disclosed in U.S. Pat. No. 3,661,614 to Bessemir et al.

An example of radiation depolymerizable materials that may be useful in other embodiments of the invention are 3-oximino-2-butanone methacrylate which undergoes main chain scission upon U.V. exposure and poly 4'-alkyl acylophenones. See Reichmanis, E.; *Am. Chem. Soc. Div. Org. Coat. Plast. Chem. Prepr.* 1980. 43, 243-251 and Lukac, I.; Chmela S., Int. Conf. on Modif. Polym. 5th. Bratislave, Czech. July 3-6, 1979, I.U.P.A.C. Oxford, England 1979, 1, 176-182.

The radiation sensitive composition must make up a large enough proportion of the internal phase to effectively control the flow of the internal phase upon development. This generally means that the radiation sensitive material must constitute approximately 40 to 99% by weight of the internal phase of the microcapsules.

In most cases, the radiation sensitive composition includes a photoinitiator. It is possible to use either photoinitiators which are converted to an active species by homolytic cleavage upon absorption of radiation or those which generate a radical by abstracting a hydrogen from a hydrogen donor. There may also be used photoinitiators which complex with the sensitizer to produce a free radical generating species or photoinitiators which otherwise generate radicals in the presence of a sensitizer. If the system relies upon ionic polymerization, the photoinitiator may be the anion or cation generating type, depending on the nature of the polymerization.

Examples of photoinitiators useful in the present invention include diaryl ketone derivatives, quinones and benzoin alkyl ethers. Where ultraviolet sensitivity is desired, suitable photoinitiators include alkoxy phenyl ketones, O-acylated oximinoketones, polycyclic quinones, phenanthrenequinone, naphthoquine, diisopropylphenanthrenequinone, benzophenones and substituted benzophenones, xanthones, thioxanthones, halogenated compounds such as chlorosulfonyl and chloromethyl polynuclear aromatic compounds, chlorosulfonyl and chloromethyl heterocyclic compounds, chlorosulfonyl and chloromethyl benzophenones and fluorenones, and haloalkanes.

In many cases it is advantageous to use a combination of imaging photoinitiators. For ultraviolet sensitivity one desirable combination is a combination of Michler's ketone and benzoin methyl ether (preferred ratio 2:5). Another useful combination is 2,2'-dimethoxy- 2-phenylacetophenone, isopropylxanthone and ethyl para-dimethylaminobenzoate. The later is preferably used with TMPTA to provide a radiation sensitive composition.

Various image-forming agents can also be used. For example, images can be formed by the interaction of color formers and color developers of the type conventionally used in the carbonless paper art. In addition, images can be formed by the color producing interaction of a chelating agent and a metal salt or by the reaction of certain oxidation-reduction reaction pairs, many of which have been investigated for use in pressure-sensitive carbonless papers. Alternatively, an oil soluble dye can be used and images can be formed by transfer to plain or treated paper. The internal phase itself has its own image-forming capability. For example, it is known that the toner used in xerographic recording processes selectively adheres to the image areas of an imaging sheet exposed and developed as in the present invention.

Furthermore, the image-forming agent can be provided inside the microcapsules, in the microcapsule wall, or outside the microcapsules in the same layer as the microcapsules or in a different layer. In the latter cases, the internal phase picks up the image-forming agent (e.g., by dissolution) upon being released from the microcapsules and carries it to the developer layer or an associated developer sheet.

Typical color precursors useful in the aforesaid embodiments include colorless electron donating type compounds. Representative examples of such color formers include substantially colorless compounds having in their partial skeleton a lactone, a lactam, a sulfone, a spiropyran, an ester or an amido structure such as triarylmethane compounds, bisphenylmethane compounds, xanthene compounds, fluorans, thiazine compounds, spiropyran compounds and the like. Crystal Violet Lactone and Copikem X, IV and XI are often used alone or in combination as color precursors in the present invention.

Illustrative examples of color developers useful in conjunction with the embodiment employing the aforesaid color precursors are clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts or aromatic carboxylic acids such as zinc salicylate, tin salicylate, zinc 2-hydroxy naphthoate, zinc 3,5 di-tert butyl salicylate, oil soluble metal salts or phenol-formaldehyde novolak resins (e.g., see U.S. Pat. Nos. 3,672,935; 3,732,120 and 3,737,410) such as zinc modified oil soluble phenol-formaldehyde resin as disclosed in U.S. Pat. No. 3,732,120, zinc carbonate etc. and mixtures thereof.

The aforementioned color formers and color developers can be used interchangably, that is the color former can be encapsulated and the developer can be provided in a layer or vice versa.

An example of an image-forming salt-chelate pair is nickel nitrate and N,N'bis (2-octanoyloxyethyl)-dithiooxamide. It is preferable to encapsulate the chelating agent and use the salt in a developer layer.

Substantially any benign colored dye can be used as an image-forming agent. A few examples are Sudan Blue and Rhodamine B dyes. The dyes are preferably oil soluble since the most easily employed encapsulation techniques are conducted using an aqueous continuous phase.

The most common substrate for this invention is paper. The paper may be a commercial impact raw stock, or special grade paper such as cast-coated paper or chrome-rolled paper. The latter two papers are preferred when using microcapsules having a diameter between approximately 1 and 5 microns, because the surface of these papers is smoother and therefore the microcapsules are not as easily embedded in the stock fibers. Transparent substrates such as polyethylene terephthalate and translucent substrates can also be used in this invention.

The cover sheet can be formed from any material which uniformly transmits the actinic radiation relied upon to expose the imaging sheet. Representative examples include polyvinyl chloride, polyvinylidene chloride, polystyrene, polyethylene, polypropylene, cellulose acetate, cellulose propionate, cellulose butyrate, polyamides, polyacrylates, polyesters such as Mylar (PET), etc. Otherwise, if the cover sheet is applied after exposure and only used as a development means, the cover sheet can be formed from substantially any supportive material having good affinity for the adhesive. For example, paper and metal foils can be used. The thickness of the sheet is such that it provides the requisite strength to be peeled from the layer of microcapsules and rupture the microcapsules.

An adhesive is usually used to attach the cover sheet. Suitable adhesives can be selected from various commercially available adhesives. If the cover sheet is applied subsequent to the manufacture of the imaging sheet, a pressure sensitive adhesive is generally used to adhere the adhesive to the layer of microcapsules. If the sheet is applied during manufacture, a wide range of setting adhesives can be used. Some representative examples of useful pressure sensitive adhesives are Rhoplex LC-10, Rhoplex N-560 and Rhoplex P-57 (all products of Rohm & Haas Co.) Some examples of useful setting adhesives include Saran 143 (polyvinylidene chloride—a product of Dow Chemical Co.), Rhoplex P-310 (a product of Rohm & Haas Co.) and UCAR 152 (a product of Union Carbide). Of course, the cover sheet can be adhered to the layer of microcapsules without an adhesive if it is applied during manufacture. For example, a cover sheet can be formed by coating the layer of microcapsules with a peelable coating such as an acrylic latex (e.g., UCAR 4414 from Union Carbide).

To reduce interference and absorption of the exposure radiation, the thickness of the cover sheet and adhesive are preferably held to the minimum thickness that is functionally required. Of course, if the sheet and/or adhesive does not interfere with exposure, greater thickness can be used.

It is advantageous to attach the cover sheet prior to exposure and to expose the imaging sheet through the cover sheet. Oxygen reacts with the free radicals generated by exposure to actinic radiation and lessens the speed and sensitivity of the imaging sheet. When oxygen has unrestricted access to the imaging sheet, larger exposures are required to accomplish imaging. The oxygen in the microcapsules initially is consumed by reacting with the radicals that are generated upon exposure. A cover sheet, deployed on the surface of the imaging sheet prior to exposure, prevents oxygen in the atmosphere from replacing the oxygen consumed by the photochemistry and thereby reduces the total exposure required for imaging.

It has been found that a uniform pre-exposure or a co-exposure can be used to further improve the sensitivity of the imaging sheet by generating radicals which react with the oxygen present in the microcapsules to prevent it from inhibiting the imaging photochemistry during the imaging exposure. For example, a de-oxygenating exposure may be conducted by uniformly exposing the sheet to radiation of an intensity which is insufficient to form images but sufficient to sequester the oxygen present in the microcapsules. This can be carried out simultaneously with imaging exposure. Alternatively, a uniform de-oxygenating pre-exposure can be used at a somewhat higher intensity but over a shorter exposure time so as to react with the oxygen present without imaging. In both cases, the total de-oxygenating exposure (intensity × time) is sufficient to react with the oxygen in the microcapsules without initiating the imaging photochemistry. The effectiveness of de-oxygenating exposure is improved when the cover sheet is applied before exposure because the cover sheet slows the diffusion of atmospheric oxygen into the imaging sheet.

The discrete walled microcapsules used in the present invention can be produced using known encapsulation techniques including coacervation, interfacial polymerization, polymerization of one or more monomers in an oil, etc. Representative examples of suitable wall-formers are gelatin materials (see U.S. Pat. Nos. 2,730,456 and 2,800,457 to Green et al) including gum arabic, polyvinyl alcohol, carboxy-methyl-cellulose; resorcinol-formaldehyde wall formers (see U.S. Pat. No. 3,755,190 to Hart et al); isocyanate wall-formers (see U.S. Pat. No. 3,914,511 to Vassiliades); isocyanate-polyol wall-formers (see U.S. Pat. No. 3,796,669 to Kirintani et al); urea formaldehyde wall-formers, particularly urea-resorcinol-formaldehyde in which oleophilicity is enhanced by the addition of resorcinol (see U.S. Pat. Nos. 4,001,140; 4,087,376 and 4,089,802 to Foris et al); and melamine-formaldehyde resin and hydroxypropyl cellulose (see commonly assigned U.S. Pat. No. 4,025,455 to Shackle).

The material used to form the microcapsule walls must be selected for the radiation sensitive composition that is to be encapsulated such that it is substantially transparent to the exposure radiation. For the systems described above, urea-resorcinol-formaldehyde and gelatin microcapsules are generally preferred.

The mean microcapsule size used in the present invention generally ranges from about 1 to 25 microns.

An open phase system may be used instead of discrete microcapsules. This can be done by dispersing what would otherwise be the internal phase throughout a binder as discrete droplets and coating the composition on the substrate. Suitable coatings for this embodiment include polymer binders whose viscosity has been adjusted to match the dispersion required in the coating. Suitable binders are gelatin, polyvinyl alcohol, polyacrylamide, and acrylic lattices.

As previously indicated, the imaging sheets of the present invention can be constituted such that they are sensitive to ultraviolet, infrared, visible, X-ray and other types of actinic radiation. Depending upon the exposure source used and the nature of the exposing radiation, the exposure alone may cause a sufficient change in the viscosity of the internal phase to control imaging. Otherwise, exposure can be used to initiate or advance the photochemistry in the exposed areas and a subsequent uniform exposure or heat treatment can be used to enhance the image.

Imaging sheets embodying the invention imaging system can be exposed using a fairly simple exposure apparatus. In its simplest form for reflection imaging, the apparatus requires only a radiation source and means of focusing the exposure radiation from the original onto the imaging sheet. Simplified means such as this can be used with the invention because development is essentially a dry process with the internal phase and the pigment interacting in only infinitesimal droplets.

The present invention is further illustrated by the following non-limiting examples.

EXAMPLE 1

A self-contained imaging sheet was prepared by coating the following compositions, in order, on a sheet of 80 pound Black and White Enamel Stock (a product of The Mead Corporation):

Developer Coating Composition

A mixture of 240 g 25% Tamol 731 (Rohm & Haas Co.), 75 g dry HT clay, 1000 g SD-74 Resin (a synthetic developer manufactured by Sanko Chemical Co.), 15 g Calgon T (Calgon, Inc.) and 30 g Dequest 20006 (Monsanto Co.) was ground to a particle size of less than 5 microns. 65 parts by weight of the ground mixture was added to 25 parts HT clay and 10 parts Dow 501 Latex (Dow Chemical Co.). This mixture was coated on the aforementioned enamel stock using a No. 10 Meyer rod in a coat weight of 5 pounds per 3300 sq. ft.

Microcapsule Coating

A solution of 50 g TMPTA, 12 g Irgacure 651 (Ciba Giegy), 1 g Quantacure ITX (Blenkinsop & Co., Ltd.) and 6 g of 50% Copikem X in dibutyl succinate (Hilton Davis Co.) was prepared as the photoactive internal phase. This solution was microencapsulated as follows:

A mixture of 22.6 g 20.4% Isobam, 54.5 g water and 30.8 g gum arabic was heated with stirring to 60° C. and the pH was adjusted to 4.0 with the addition of 20% sulfuric acid. Thereafter 8.3 g urea and 0.8 g resorcinol were added and the solution was maintained at 60° C. to prepare a continuous phase. The continuous phase was placed in a Waring blender and the photoactive internal phase at 60° C. was added with blending at 90 V for 90 seconds. Thereafter the speed of the blender was reduced to 40 V and 21.4 ml of 37% formaldehyde was added. Blending was continued at that speed for 2 hours at 60° C. The emulsion was then transferred to a metal beaker and 0.6 g of ammonium sulfate in 12.2 g water was added. This emulsion was stirred with an overhead mixer at 60° C. for another hour and the pH was adjusted to 9.0 using a 10% solution of sodium hydroxide. Finally, 2.8 g sodium bisulfite was dissolved in the mixture with stirring.

The microcapsule preparation was diluted 1:1 with water containing 1% Triton-X 100 (Rohm & Hass Co.) and coated on the developer layer to provide a coat weight of about 6 g/m$^2$.

The self-contained imaging sheet prepared as above was exposed through a step wedge for 32 seconds in a sensitometer equipped with one BL T8/BL and one 15T8/D fluorescent tube, sample nominally 10–12.5 cm from tube surface. Thereafter a strip of Scotch Brand transparent tape was applied to the layer of microcapsules over the area which had been exposed through the step wedge as a cover sheet. The tape was then removed by peeling it from the self-contained sheet and the sheet was heated 15 seconds at 100° C. to bring up the image. A visible image of the step wedge was obtained.

EXAMPLE 2

Example 1 was repeated except the cover sheet was applied prior to exposure and the self-contained imaging sheet was exposed through the cover sheet. Again, upon removing the cover sheet and heating, a visible image was obtained.

Having described the invention in detail and with respect to specific embodiments thereof, it will be apparent that numerous variations and modifications are possible without departing from the scope of the following claims:

What is claimed is:

1. An imaging sheet comprising:
   a support, a layer of microcapsules on said support,
said microcapsules containing an internal phase including a radiation sensitive composition which undergoes a change in viscosity upon exposure to actinic radiation and an image-forming agent, and
a strippable cover sheet formed from a material transparaent to said actinic radiation,
said cover sheet being uniformly adhered to said layer of microcapsules prior to exposure, wherein said imaging sheet is useful in forming images by image-wise exposing said imaging sheet to actinic radiation and separating said cover sheet from said layer of microcapsules, whereby said microcapsules rupture and image-wise release said image-forming agent.

2. The imaging sheet of claim 1 wherein said radiation sensitive composition is a photohardenable or photosoftenable composition.

3. The imaging sheet of claim 2 wherein said radiation sensitive composition includes an ethylenically unsaturated compound.

4. The imaging sheet of claim 3 wherein said microcapsules have discrete walls.

5. The imaging sheet of claim 4 wherein said cover sheet is adhered to said layer of capsules by a layer of an adhesive.

6. The imaging sheet of claim 5 wherein said image-forming agent is a color former.

7. The imaging sheet of claim 6 wherein said imaging sheet further comprises a developer material present on the same support as said layer of microcapsules.

8. The imaging sheet of claim 6 wherein said imaging sheet is useful in forming images in a transfer process wherein a developer material is present on a support separate and distinct from said support carrying said layer of microcapsules and said color former is transferred from said imaging sheet to said developer.

9. The imaging sheet of claim 7 wherein said developer material is provided as a layer interposed between said layer of microcapsules and said support.

10. The imaging sheet of claim 1 wherein said cover sheet is substantially impermeable to oxygen.

11. The imaging sheet of claim 7, wherein said color former is a substantially colorless electron donating compound and said developer material is an electron accepting compound.

12. The imaging sheet of claim 8 wherein said color former is a substantially colorless electron donating compound and said developer material is an electron accepting compound.

13. The imaging sheet of claim 3 wherein said radiation sensitive composition additionally comprises a photoinitiator.

14. An imaging sheet comprising:
a support,
a layer of microcapsules on said support,
said microcapsules having discrete microcapsule walls and containing a radiation sensitive composition and a color former in the internal phase,
said radiation sensitive material including an ethylenically unsaturated compound and a photoinitiator such that said radiation sensitive material undergoes an increase in viscosity upon exposure to actinic radiation, and
a strippable cover sheet formed from a material transparent to said actinic radiation,
said cover sheet being uniformly adhered to said layer of microcapsules prior to exposure, wherein said imaging sheet is useful in forming images by image-wise exposing said imaging sheet to actinic radiation and separating said cover sheet from said layer of microcapsules whereby said microcapsules rupture and image-wise release said color former.

15. The imaging sheet of claim 14 wherein said cover sheet is adhered to said microcapsules by a layer of an adhesive.

16. The imaging sheet of claim 14 wherein said cover sheet is substantially oxygen impermeable.

17. The imaging sheet of claim 14 wherein said color former is a substantially colorless electron donating compound.

18. The imaging sheet of claim 17 wherein said sheet further comprises a layer of a developer material interposed between said support and said layer of microcapsules so as to provide a self-contained imaging sheet.

19. The imaging sheet of claim 14 wherein a developer material is provided on a support separate and distinct from said support carrying said microcapsules so as to provide in combination with said imaging sheet a transfer imaging system.

20. A process for imaging which comprises:
image-wise exposing an imaging sheet comprising a support having on one surface thereof a layer of microcapsules containing a radiation sensitive composition which undergoes a change in viscosity upon exposure to actinic radiation and an image-forming agent in the internal phase, said imaging sheet having a strippable cover sheet uniformly adhered to said layer of microcapsules prior to exposure, said cover sheet being substantially transparent to actinic radiation, and
separating said strippable cover sheet from said layer of microcapsules and thereby rupturing said microcapsules and image-wise releasing said image-forming agent.

21. The process of claim 20 wherein said image-forming agent is a color former, and a developer material is associated with said imaging sheet such that it reacts with said color former to form a color image.

22. The process of claim 21 wherein said developer material is present on the same support as the support carrying said layer of microcapsules such that, upon separating said cover sheet, said color former reacts with said developer material and forms a color image.

23. The process of claim 21 wherein said developer material is present support separate and distinct from said support carrying said layer of microcapsules and said process further comprises contacting said imaging sheet with said developer sheet after separating said cover sheet from said layer of microcapsules, such that said color former is transferred to said developer material where it reacts and produces a color image.

24. A process for imaging which comprises:
image-wise exposing an imaging sheet including a support having a layer of microcapsules on the surface thereof, said microcapsules having discrete walls and containing a radiation sensitive composition which undergoes a change in viscosity upon exposure to actinic radiation and an image-forming agent, and a strippable cover sheet fromed from a material transparent to said actinic radiation, said cover sheet carrying a layer of adhesive on one surface thereof and being uniformly adhered to said layer of microcapsules by said adhesive prior to exposure, and separating said cover sheet from said layer of microcapsules and thereby rupturing said microcapsules and image-wise releasing said image-forming agent.

25. The process of claim 24 wherein said image-forming agent is a color former and developer material is associated with said imaging sheet such that it reacts with said released color former to form a color image.

26. The process of claim 25 wherein said developer material is present on the same support as the support carrying said layer of microcapsules such that, upon separating said cover sheet, said color former reacts with said developer material and forms an image.

27. The process of claim 25 wherein said developer material is present on a support separate and distinct from said support carrying said layer of microcapsules and said process further comprises contacting said imaging sheet with said developer sheet after separating said cover sheet from said layer of microcapsules such that said color former is transferred to said developer material where it reacts and produces a color image.

* * * * *